(12) United States Patent
Viswanathan

(10) Patent No.: US 6,798,292 B1
(45) Date of Patent: Sep. 28, 2004

(54) HIGHLY LINEAR LOW VOLTAGE RAIL-TO-RAIL INPUT/OUTPUT OPERATIONAL AMPLIFIER

(75) Inventor: Tandur L. Viswanathan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 39 days.

(21) Appl. No.: 10/383,986

(22) Filed: Mar. 7, 2003

(51) Int. Cl.[7] .................................................. H03F 3/45
(52) U.S. Cl. ...................................... 330/257; 330/253
(58) Field of Search ................................ 330/257, 255, 330/253, 258

(56) References Cited

U.S. PATENT DOCUMENTS 5,650,753 A * 7/1997 Ling ........................... 330/253
6,586,995 B1 * 7/2003 Tachibana ................... 330/253
6,614,302 B2 * 9/2003 Abe ............................ 330/253

* cited by examiner

*Primary Examiner*—Henry Choe
(74) *Attorney, Agent, or Firm*—Alan K. Stewart; W. James Brady, III; Frederick J. Telecky, Jr.

(57) ABSTRACT

An operational amplifier circuit includes: a first differential pair 20 of a first conductivity type having a first current branch and a second current branch; a second differential pair 22 of a second conductivity type having a first current branch and a second current branch; a first current mirroring device MP11 and MP26 coupled between the first branch of the first differential pair 20 and the second branch of the second differential pair 22 for combining the currents from these two branches; and a second current mirroring device, MN22 and MN24 coupled between the first branch of the second differential pair 22 and the second branch of the first differential pair 20 for combining the currents from these two branches.

7 Claims, 1 Drawing Sheet

HIGHLY LINEAR LOW VOLTAGE RAIL-TO-RAIL INPUT/OUTPUT OPERATIONAL AMPLIFIER

FIELD OF THE INVENTION

This invention generally relates to electronic systems and in particular it relates to operational amplifiers.

SUMMARY OF THE INVENTION

An operational amplifier circuit includes: a first differential pair of a first conductivity type having a first current branch and a second current branch; a second differential pair of a second conductivity type having a first current branch and a second current branch; a first current mirroring device coupled between the first branch of the first differential pair and the second branch of the second differential pair for combining the currents from these two branches; and a second current mirroring device coupled between the first branch of the second differential pair and the second branch of the first differential pair for combining the currents from these two branches.

DETAILED DESCRIPTION OF PREFERRED EMBODIMENTS

Figure 1:
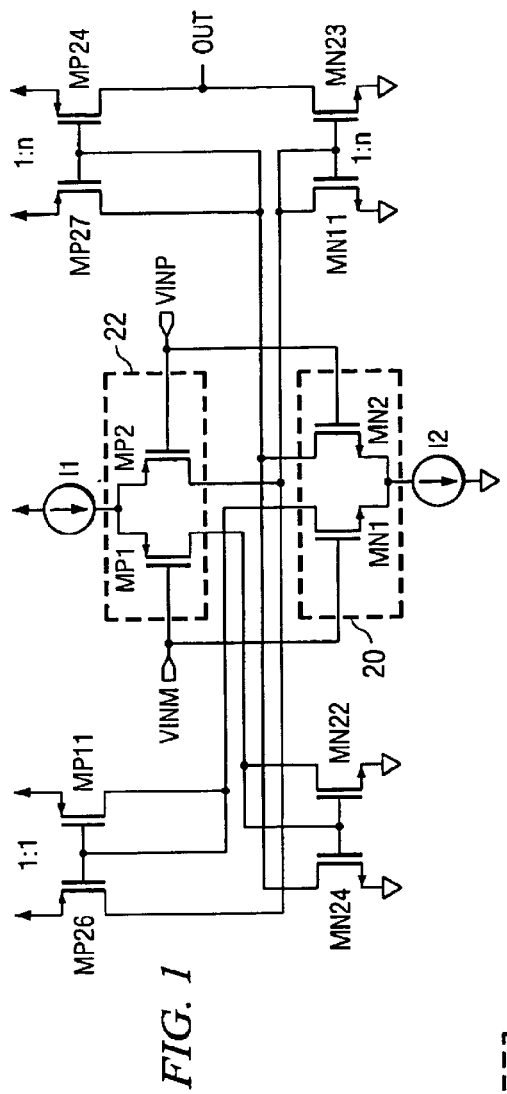
FIG. 1 is a schematic circuit diagram of a preferred embodiment highly linear rail-to-rail input/output operational amplifier stage.

A preferred embodiment highly linear rail-to-rail input/output operational amplifier stage that works for supply voltages less than 1 volt is shown in FIG. 1. This is highly suitable for voltage-follower operation in feedback loops of phase locked loops (PLLs) and delay locked loops (DLLs) in low voltage technologies.

The amplifier stage of FIG. 1 includes: PMOS transistors MP1, MP2, MP11, MP24, MP26, and MP27; NMOS transistor MN1, MN2, MN11, MN22, MN23, and MN24; current source I1 and I2; inputs VINM and VINP; and output OUT. The amplifier, shown in FIG. 1, has an input stage having rail-to-rail common mode range. This is made up of a pair of differential stages: an N-channel differential pair 20 and a P-channel differential pair 22 as shown in FIG. 1. The rail-to-rail output stage is made up of devices (transistors) MP24 and MN23. The mirroring devices (transistors) MP27 and MN11 determine the current in devices MP24 and MN23, respectively.

The innovation in this design is due to the method employed for bringing in the currents into devices MP27 and MN11 as mirrored versions of the output currents in the dual differential input stages. Focusing on the N-channel input pair 20, the drain current of transistor MN2 flows into transistor MP27 which is diode connected to mirror into transistor MP24. Similarly, the current out of transistor MN1 is mirrored through transistors MP11 and MP26 and fed into transistor MN11 to be mirrored into transistor MN23. It is assumed that transistors MP11 and MP26 are matched. The transistor pair MP27 and MP24, and transistor pair MN11 and MN23 can be ratioed (1:n) to the desired level. A similar mirroring arrangement is used for the currents out of the p-channel pair 22.

The important fact to note is that currents coming into transistors MP27 and MN11 are from one branch of each of the input pairs 20 and 22. This arrangement is much simpler than the typical prior art solutions ("An Easy-to-Design Rail-to-Rail CMOS Op-amp with High CMRR", G. Klisnick and M. Redon, 1997 Int. Symp. on VLSI Tech., Sys. & App., pp. 62–64) and U.S. Pat. No. 5,337,008, Aug. 9, 1994 and U.S. Pat. No. 6,462,619, Oct. 8, 2002.

Figure 2:
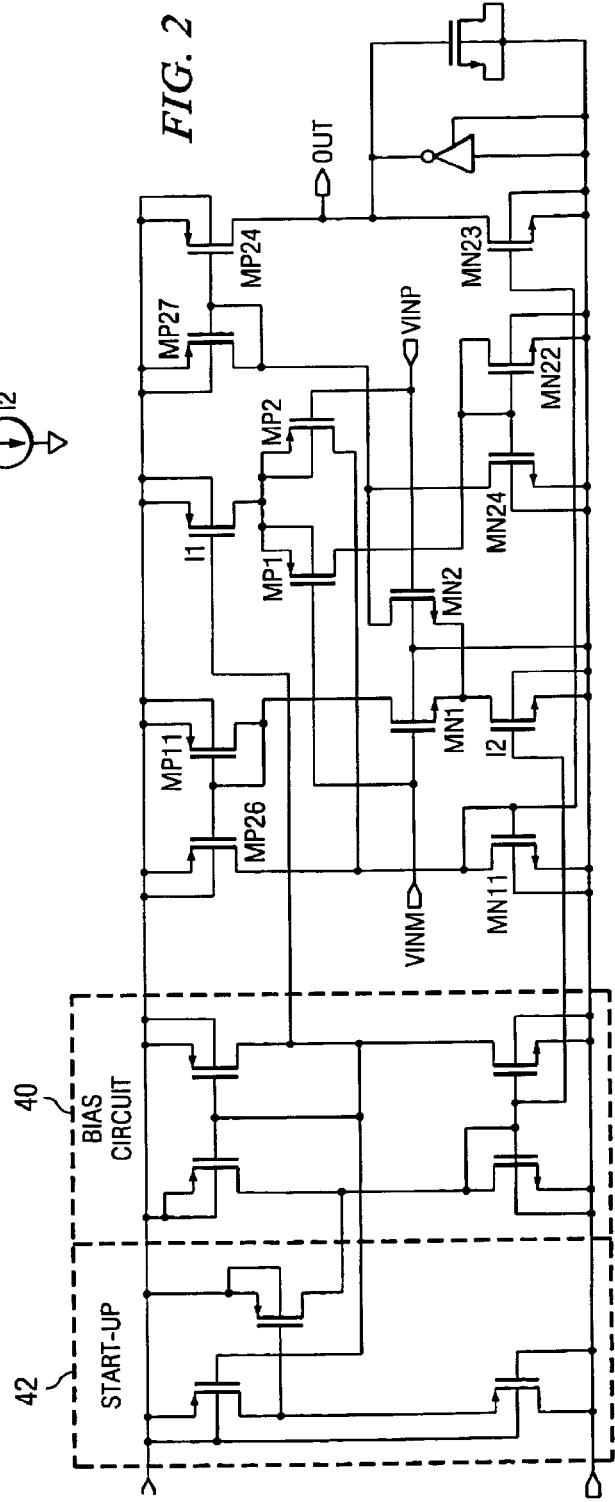
FIG. 2 is a schematic circuit diagram of a more detailed example of the circuit of FIG. 1 including a bias generator and a startup circuit.

A complete schematic of the operational amplifier including a bias generator 40 and startup circuit 42 is shown in FIG. 2.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:

a first differential pair of a first conductivity type having a first current branch and a second current branch;

a second differential pair of a second conductivity type having a first current branch and a second current branch;

a first current mirroring device coupled between the first branch of the first differential pair and the second branch of the second differential pair;

a second current mirroring device coupled between the first branch of the second differential pair and the second branch of the first differential pair;

a third current mirroring device coupled between the second branch of the first differential pair and an output node; and a fourth current mirroring device coupled between the second branch of the second differential pair and the output node.

2. The circuit of claim 1 wherein the first differential pair is an N channel differential pair and the second differential pair is a P channel differential pair.

3. The circuit of claim 1 wherein the first current mirroring device comprises:

a first transistor coupled to the first branch of the first differential pair, the first transistor is diode connected; and a second transistor coupled to the second branch of the second differential pair and having a control node coupled to a control node of the first transistor.

4. The circuit of claim 3 wherein the second current mirroring device comprises:

a third transistor coupled to the first branch of the second differential pair, the third transistor is diode connected; and a fourth transistor coupled to the second branch of the first differential pair and having a control node coupled to a control node of the third transistor.

5. The circuit of claim 1 wherein the third current mirroring device comprises:

a first transistor coupled to the second branch of the first differential pair, the first transistor is diode connected; and a second transistor coupled to the output node and having a control node coupled to a control node of the first transistor.

6. The circuit of claim 5 wherein the fourth current mirroring device comprises:
 a third transistor coupled to the second branch of the second differential pair, the third transistor is diode connected; and
 a fourth transistor coupled to the output node and having a control node coupled to a control node of the third transistor.

7. The circuit of claim 1 further comprising:
 a first differential input node coupled to a control node of the first branch of the first differential pair and to a control node of the first branch of the second differential pair; and
 a second differential input node coupled to a control node of the second branch of the first differential pair and to a control node of the second branch of the second differential pair.

* * * * *